United States Patent
Ausserlechner

(10) Patent No.: US 8,564,286 B2
(45) Date of Patent: Oct. 22, 2013

(54) GMR SENSORS HAVING REDUCED AMR EFFECTS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 641 days.

(21) Appl. No.: 12/824,687

(22) Filed: Jun. 28, 2010

(65) Prior Publication Data

US 2011/0316533 A1    Dec. 29, 2011

(51) Int. Cl.
*G01R 33/02* (2006.01)
*B82Y 25/00* (2011.01)

(52) U.S. Cl.
CPC ........................... *B82Y 25/00* (2013.01)
USPC .......................................... 324/252

(58) Field of Classification Search
None
See application file for complete search history.

(56) References Cited

U.S. PATENT DOCUMENTS

| | | | |
|---|---|---|---|
| 4,053,829 A | 10/1977 | Maruo | |
| 6,633,462 B2 | 10/2003 | Adelerhof | |
| 7,193,411 B2 * | 3/2007 | Sudo et al. | 324/207.21 |
| 7,265,540 B2 | 9/2007 | Sudo | |
| 2003/0070497 A1 | 4/2003 | Kikuchi | |

FOREIGN PATENT DOCUMENTS

| | | |
|---|---|---|
| DE | 19649265 | 6/1998 |
| DE | 10056515 | 5/2001 |
| DE | 10257253 | 2/2004 |
| DE | 10342260 | 4/2005 |
| EP | 730162 | 9/1996 |
| WO | WO 00/79298 | 12/2000 |

* cited by examiner

*Primary Examiner* — Paresh Patel
(74) *Attorney, Agent, or Firm* — Patterson Thuente Pedersen, P.A.

(57) ABSTRACT

Embodiments related to giant magneto resistance (GMR) angle sensor layouts having reduced anisotropic magneto resistance (AMR) effects. Embodiments provide GMR angle sensor layouts that reduce or eliminate distortion related to AMR effects, can be more easily scaled up or down, and are more compact to use available surface area more efficiently.

25 Claims, 3 Drawing Sheets

GMR SENSORS HAVING REDUCED AMR EFFECTS

TECHNICAL FIELD

The invention relates generally to giant magneto resistance (GMR) sensors and more particularly to GMR angle sensor layouts having reduced anisotropic magneto resistance (AMR) effects.

BACKGROUND

Giant magneto resistance (GMR) sensors can be used in various angular position sensing applications, including steering angle sensing in automotive applications and in brushless DC motor commutation and rotary switch applications. In use, the resistance of GMR layers in a GMR angle sensor varies in response to an angle between the magnetization of a free layer and a reference direction. The reference direction can be defined by a hard, or permanent, magnetic magnetization of a reference layer of the angle sensor. The resistance of a GMR resistor can be expressed as:

$$R=R0*(1+GMR*\cos(phi))$$

where phi is the angle between the magnetization of the reference layer and the magnetization of the free layer, R0 is the resistance at phi=90 degrees, and GMR is a dimensionless number specifying the strength of the GMR effect.

Anisotropic magneto resistance (AMR) sensors are also known and have a resistance that is a function of an angle between an applied magnetic field and current flow lines through a soft magnetic electrically conducting layer:

$$R=R0*(1+AMR*(\cos(psi))^2)$$

where psi is the angle between the current flowlines and the magnetization of the soft magnetic layer, R0 is the resistance at psi=90 degrees, and AMR is a dimensionless number specifying the strength of the AMR effect.

Both GMR and AMR resistors can generally comprise metallic thin films having small sheet resistances such that many strips arranged in serpentines are used to build up larger resistors. A drawback of GMR resistors, however, is that they also have small AMR effects, which can distort results. The resistance of a GMR resistor when considering the AMR effect can be expressed as:

$$R=R0*(1+GMR*\cos(phi)+AMR*(\cos(psi))^2)$$

Therefore, there is a need for a GMR angle sensor having a reduced AMR effect.

SUMMARY

In an embodiment, a giant magneto resistance (GMR) sensor comprises a first half-bridge comprising a first resistor coupled to a supply voltage terminal and a second resistor coupled to a ground terminal; and a second half-bridge comprising a third resistor and a fourth resistor, the third resistor coupled to the supply voltage terminal, and the fourth resistor coupled to the ground terminal, wherein two of the first, second, third and fourth resistors are oriented to provide a first current flow direction, and the other two of the first, second, third and fourth resistors are oriented to provide a second current flow direction being perpendicular to the first current flow direction, and wherein a current flow direction of the second resistor is perpendicular to a current flow direction of the third resistor.

In another embodiment, a GMR sensor comprises a first reference layer portion having a first meander and a second meander disposed thereon, the first meander coupled to a supply voltage terminal and comprising a first portion and a second portion, and the second meander coupled to a ground terminal and comprising a third portion and a fourth portion; a second reference layer portion having a third meander and a fourth meander disposed thereon, the third meander coupled to a supply voltage terminal and comprising a fifth portion and a sixth portion and forming a first half-bridge with the second meander, and the fourth meander coupled to a ground terminal and comprising a seventh portion and an eighth portion and forming a second half-bridge with the first meander, wherein two of the first, second, third and fourth meanders are arranged to have a first current flow direction, and the other two of the first, second, third and fourth meanders are arranged to have a second current flow direction perpendicular to the first current flow direction, and wherein a current flow direction of the second meander is perpendicular to a current flow direction of the third meander.

In another embodiment, a method comprises providing a giant magneto resistance (GMR) sensor having full-bridge layout; and coupling first and second resistors of the GMR sensor to a supply voltage and third and fourth resistors of the GMR sensor to ground, two of the first, second, third and fourth resistors configured to provide a first direction of current flow and the other two of the first, second, third and fourth resistors configured to provide a second direction of current flow perpendicular to the first direction, the second and third resistors configured to provide perpendicular directions of current flow to one another.

BRIEF DESCRIPTION OF THE DRAWINGS

The invention may be more completely understood in consideration of the following detailed description of various embodiments of the invention in connection with the accompanying drawings, in which.

Figure 1:
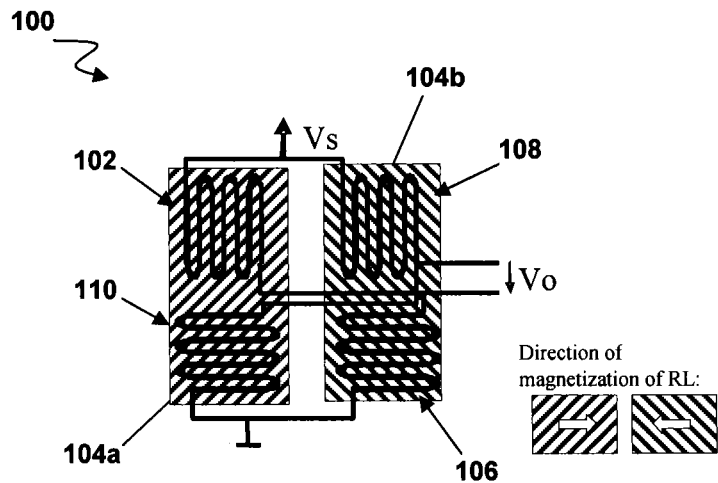
FIG. 1 depicts a GMR angle sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The invention relates to GMR angle sensor layouts having reduced AMR effects. Embodiments provide GMR angle sensor layouts that reduce or eliminate distortion related to AMR effects, can be more easily scaled up or down, and are more compact to use available surface area more efficiently.

FIG. 1 depicts a layout of a GMR sensor 100 according to an embodiment. GMR sensor 100 comprises a full-bridge layout having two half-bridges. A first half-bridge includes top left (with respect to the orientation of the drawing on the page) meander 102 disposed on reference layer 104a coupled in series with bottom right meander 106 disposed on reference layer 104b. A second half-bridge includes top right meander 108 disposed on reference layer 104b coupled in series with bottom left meander 110 disposed on reference layer 104a. Meanders 102 and 108 can also be referred to as vertical meanders, with respect to the orientation of the longer meander strips on the page, and meanders 106 and 110 as horizontal meanders, though in practice the orientations may not in fact be vertical or horizontal. The terms are therefore used herein for the sake of convenience and illustration and are not limiting.

The direction of magnetization of reference layers 104a and 104b varies in embodiments. In the embodiment depicted, reference layer 104a has a magnetization going from left to right, while reference layer 104b is the opposite. In an embodiment, reference layers 104a and 104b are disposed on a die surface (not depicted in FIG. 1).

Meanders 102 and 108 are coupled to a supply voltage Vs, while meanders 106 and 110 are coupled to ground and an output voltage Vo is measured between the meanders of each half-bridge. Thus, the current flows in the same direction in meanders 102 and 108, and in meanders 106 and 110, with the current flow direction in meanders 102 and 108 being perpendicular to that in meanders 106 and 110. This configuration effectively cancels any AMR effects between the two half-bridges.

Figure 2:
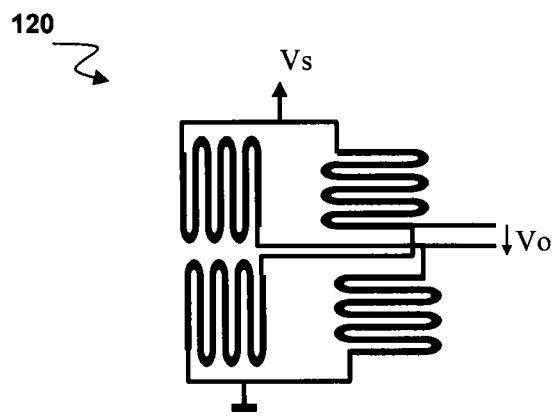
FIG. 2 depicts an AMR angle sensor according to an embodiment.

This can be seen by comparing GMR sensor 100 with an AMR sensor layout. Referring to FIG. 2, a layout of an AMR sensor 120 is depicted. In AMR sensor 120, AMR contributions of each half-bridge are added given the rotated orientations of resistive half-bridge components. Comparing the layout of AMR sensor 120 with the layout of GMR sensor 100, however, shows that the orientations of meanders 108 and 110 of GMR sensor 100 are reversed with respect to the orientation of the same meanders in AMR sensor 120. Thus, the AMR contribution of the half-bridge of GMR sensor 100 comprising meanders 108 and 110 is subtracted instead of added as in AMR sensor 120 and thereby reduced or eliminated.

Figure 3:
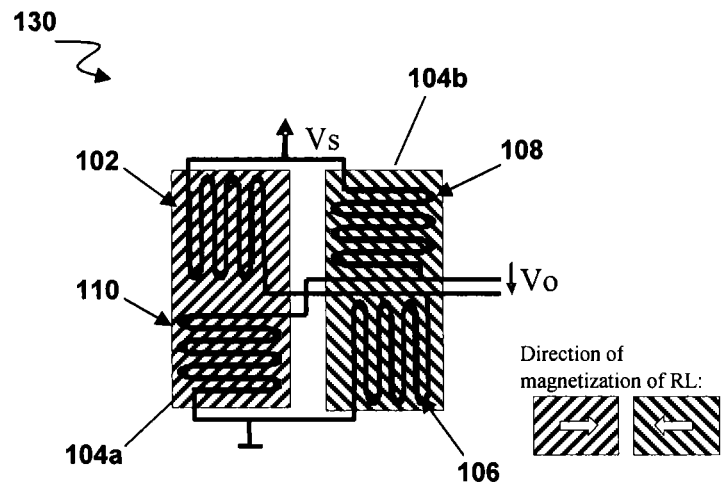
FIG. 3 depicts a GMR angle sensor according to an embodiment.

Another embodiment is depicted in FIG. 3. Similar to GMR sensor 100 of FIG. 1, GMR sensor 130 cancels half-bridge AMR contributions as discussed above. The arrangement of GMR sensor 130 accomplishes this by having identical AMR contributions in both resistors of each half-bridge. In other words, each half-bridge has no AMR-related contribution because any contribution is canceled within the half-bridge, as compared to GMR sensor 100 in which any AMR contribution is canceled between the two half-bridges.

Figure 4:
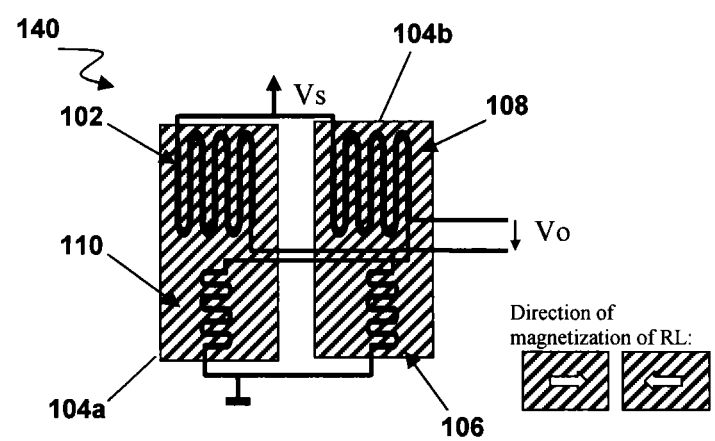
FIG. 4 depicts a GMR angle sensor according to an embodiment.

Another advantage provided by embodiments is a general immunity of the differential output signal to differing nominal resistances between the horizontal meanders (e.g., meanders 106 and 110 in FIG. 1) and vertical meanders (e.g., meanders 102 and 108 in FIG. 1). Variations in resistances can be caused, for example, by systemic differences in meander shape due to design, processing or manufacturing inconsistencies, among others. Thus, a design which is not sensitive to these differences provides advantages. In embodiments, therefore, the sizes and shapes of the vertical and horizontal meanders may vary, with or without intention. For example, FIG. 4 depicts an embodiment of a GMR sensor 140 in which horizontal meanders 106 and 110 are shorter and narrower, with respect to the orientation on the page, than vertical meanders 102 and 108. While the common mode of the output signal is effected, the differential output signal is not.

Figure 5:
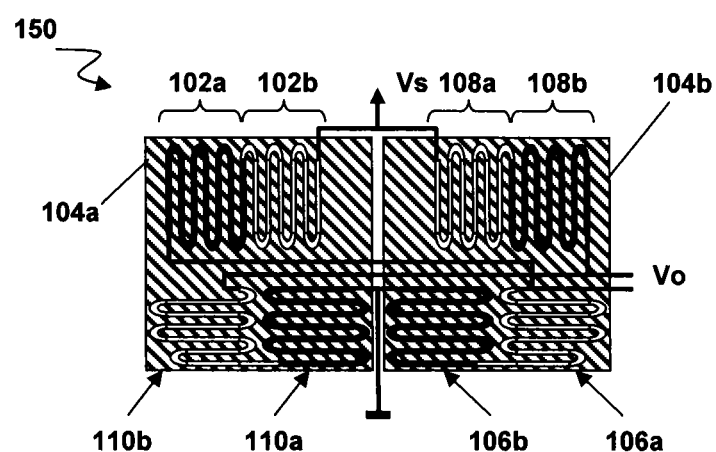
FIG. 5 depicts a GMR angle sensor according to an embodiment.

In FIG. 5, another embodiment is depicted. GMR angle sensor 150 includes four meanders 102, 106, 108 and 110. Meander 102 includes a first portion 102a and a second portion 102b, wherein the portion 102a and 102b are arranged contiguously or serially. Meander 108 similarly includes portions 108a and 108b. Each portion 102a,b and 108a,b is approximately square in circumference, such that each can be rotated 90 degrees to the orientations of lower meanders 106 and 110. Meander portion 110b, for example, corresponds to rotated meander portion 102b. As in other embodiments, the direction of current flow through meanders 102 and 108, both coupled to supply voltage Vs is the same, with the direction of current flow in meanders 106 and 110 also the same, but perpendicular with respect to that in meanders 102 and 108.

In other embodiments, one or more of the meanders can otherwise vary in size, length and composition. For example, one or more of the meanders can have more or fewer turns and/or branches. The curved portions of one or more of the meanders can be angled, pointed, broader and/or narrower. The lengths of one or more of the meanders can vary, as can other physical characteristics. In general, however, the two meanders coupled to the supply voltage in a full-bridge layout of a GMR angle sensor have a first current flow direction while the other two meanders coupled to ground have a second current flow direction different from and perpendicular to the first current flow direction. Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:
1. A giant magneto resistance (GMR) sensor comprising:
   a first half-bridge comprising a first resistor coupled to a supply voltage terminal and a second resistor coupled to a ground terminal; and a second half-bridge comprising a third resistor and at fourth resistor, the third resistor coupled to the supply voltage terminal, and the fourth resistor coupled to the ground terminal, wherein two of the first, second, third and fourth resistors are oriented to provide a first current flow direction, and the other two of the first, second, third and fourth resistors are oriented to provide a second current flow direction being perpendicular to the first current flow direction, and wherein a current flow direction of the second resistor is perpendicular to a current flow direction of the third resistor.

2. The GMR sensor of claim 1, wherein the first and fourth resistors are disposed on a first reference layer and the second and third resistors are disposed on a second reference layer.

3. The GMR sensor of claim 2, wherein a direction of magnetization of the first reference layer is opposite a direction of magnetization of the second reference layer.

4. The GMR sensor of claim 1, wherein the first, second, third and fourth resistors comprise meanders.

5. The GMR sensor of claim 4, wherein the first current flow direction corresponds to a strip portion of the first and third resistors, and the second current flow direction corresponds to a strip portion of the second and fourth resistors.

6. The GMR sensor of claim 1, wherein an output voltage terminal is coupled between the first and second resistors and between the third and fourth resistors.

7. The GMR sensor of claim 1, wherein the GMR sensor comprises an angle sensor.

8. The GMR sensor of claim 1, wherein an anisotropic magneto resistance (AMR) effect of the first half-bridge is at least partially canceled by an AMR effect of the second half-bridge.

9. The GMR sensor of claim 1, wherein a nominal resistance of at least one of the first or third resistors is not equal to a nominal resistance of at least one of the second or fourth resistors.

10. The GMR sensor of claim 1, wherein the two of the first, second, third and fourth resistors are the first and third resistors and the other two are the second and fourth resistors.

11. The GMR sensor of claim 1, wherein the two of the first, second, third and fourth resistors are the first and second resistors and the other two are the third and fourth resistors.

12. A giant magneto resistance (GMR) sensor comprising:
a first reference, layer portion having a first meander and a second meander disposed thereon, the first meander coupled to a supply voltage terminal and comprising a first portion and a second portion, and the second meander coupled to a ground terminal and comprising a third portion and a fourth portion;
a second reference layer portion having a third meander and a fourth meander disposed thereon, the third meander coupled to a supply voltage terminal and comprising a fifth portion and a sixth portion and forming a first half-bridge with the second meander, and the fourth meander coupled to a ground terminal comprising a seventh portion and an eighth portion and forming a second half-bridge with the first meander,
wherein two of the first, second, third and fourth meanders are arranged to have a first current flow direction, and the other two of the first, second, third and fourth meanders are arranged to have a second current flow direction perpendicular to the first current flow direction, and wherein a current flow direction of the second meander is perpendicular to a current flow direction of the third meander.

13. The GMR sensor of claim 12, wherein an orientation of the third, fourth, seventh and eighth portions is rotated about 90 degrees with respect to an orientation of the first, second, fifth and sixth portions.

14. The GMR sensor of claim 12, wherein strip portions of the first and second portions and the fifth and sixth portions are arranged substantially parallel to one another.

15. The GMR sensor of claim 12, wherein strip portions of the second and third portions are arranged adjacent to one another, and wherein strip portions of the seventh and eighth portions are arranged adjacent to one another.

16. The GMR sensor of claim 12, wherein a direction of magnetization of the first reference layer portion is the same as a direction of magnetization of the second reference layer portion.

17. The GMR sensor of claim 12, wherein the two of the first, second, third and fourth meanders are the first and third meanders and the other two are the second and fourth meanders.

18. The GMR sensor of claim 12, wherein the two of the first, second, third and fourth meanders are the first and second meanders and the other two are the third and fourth meanders.

19. A method comprising:
providing a giant magneto resistance (GMR) sensor having fall-bridge layout; and
coupling first and second resistors of the GMR sensor to a supply voltage and third and fourth resistors of the GMR sensor to ground, two of the first, second, third and fourth resistors configured to provide a first direction of current flow and the other two of the first, second, third and fourth resistors configured to provide a second direction of current flow perpendicular to the first direction, the second and third resistors configured to provide perpendicular directions of current flow to one another.

20. The method of claim 19, further comprising causing a current to flow in the first, second, third and fourth resistors.

21. The method of claim 20, further comprising measuring an output voltage between the first and fourth resistors and the second and third resistors.

22. The method of claim 19, further comprising arranging the first and third resistors on a first reference layer portion and the second and fourth resistors on a second reference layer portion.

23. The method of claim 19, further comprising forming the first, second, third and fourth resistors in meanders.

24. The method of claim 19, further comprising at least reducing an anisotropic magneto resistance (AMR) effect of the first and third resistors by an AMR effect of the second and fourth resistors.

25. The method of claim 19, wherein the two of the first, second, third and fourth resistors are the first and third resistors and the other are the second and fourth resistors.

* * * * *

UNITED STATES PATENT AND TRADEMARK OFFICE
CERTIFICATE OF CORRECTION

| | |
|---|---|
| PATENT NO. | : 8,564,286 B2 |
| APPLICATION NO. | : 12/824687 |
| DATED | : October 22, 2013 |
| INVENTOR(S) | : Udo Ausserlechner |

It is certified that error appears in the above-identified patent and that said Letters Patent is hereby corrected as shown below:

In the Claims

Claim 1, Column 5, line 1, the word "at" should read "a"

Signed and Sealed this
Twenty-fourth Day of June, 2014

Michelle K. Lee
*Deputy Director of the United States Patent and Trademark Office*